United States Patent [19]

Tomonaga

[11] Patent Number: 5,115,204
[45] Date of Patent: May 19, 1992

[54] DIFFERENTIAL AMPLIFIER

[75] Inventor: Hiroshi Tomonaga, Tokyo, Japan

[73] Assignee: Pioneer Electronic Corporation, Tokyo, Japan

[21] Appl. No.: 658,712

[22] Filed: Feb. 21, 1991

[51] Int. Cl.⁵ .............................................. H03F 3/45
[52] U.S. Cl. ..................................... 330/257; 330/261
[58] Field of Search ............... 330/252, 257, 288, 261, 330/296

[56] References Cited

U.S. PATENT DOCUMENTS 4,629,997 12/1988 Kuo ..................................... 330/257
4,724,397 2/1988 Davis ............................. 330/257 X
4,998,074 3/1991 Van Lanneren et al. ...... 330/261 X Primary Examiner—Steven Mottola
Attorney, Agent, or Firm—Sughrue, Mion, Zinn, Macpeak & Seas

[57] ABSTRACT

A differential amplifier comprises first and second transistors which are differentially coupled. The amplifier includes a load connected with collectors of the first and second transistors, wherein the base of a third transistor is connected to the collector of the first transistor. The emitter-collector path of the third transistor is connected between the collector of the second transistor and the load. An output signal is supplied from the collector of the first transistor.

10 Claims, 1 Drawing Sheet

DIFFERENTIAL AMPLIFIER

BACKGROUND OF THE INVENTION

1. Field of the Industrial Application

The present invention relates to a differential amplifier comprising transistors which are differentially coupled.

2. Description of the Prior Art

Conventional differential amplifiers are shown in FIGS. 1 and 2. In FIG. 1, Q1 and Q2 are differentially coupled PNP type transistors which are connected to a current mirror circuit 1. The current mirror functions as a collector active load which comprises a diode D1, a transistor Q5, and resistors R1 and R2. The value at the collector of transistor Q2 (one of the differentially coupled transistors) functions as the system output and Q2 operates as an outputting transistor. A PNP type transistor Q4 is connected at a point between the collector of the transistor Q1 and the current mirror circuit 1. Namely, the emitter of Q4 is connected with the collector of Q1, the collector of Q4 is connected with the current mirror circuit, and the base of Q4 is connected to ground.

In FIG. 2, a parallel circuit which comprises a resistor R3 and a condenser C1, is connected at the point between the transistor Q1 and the current mirror circuit 1 instead of the transistor Q4.

In addition, in FIGS. 1 and 2, a current generator 2 is connected with a common emitter of the coupled transistors Q1 and Q2 which are differentially connected. A voltage source +B is applied to the current generator 2 and a voltage source −B is applied to the current mirror circuit 1.

SUMMARY OF THE INVENTION

When the above-mentioned differential amplifiers are used in, for example, a voltage amplifying step of an audio amplifier, Vce of Q1 and Vce of Q2 (which represent the voltage between the collector and the emitter of the transistors) vary unevenly. This uneven variation is caused by the large gain of the output signal of Q2.

An output capacitance Cob of a transistor varies depending on the above-mentioned collector-emitter voltage Vce of that transistor. Thus, capacitance Cob will distort when Vce of the differentially coupled transistors Q1 and Q2 vary unevenly. In FIG. 1, the load of the output transistor Q2 is determined by the output resistance of transistor Q5 of the current mirror circuit 1 and the input impedance of the next step supplied with the output power. On the other hand, the load of the transistor Q1 is determined by the diode D1, the resistor R1, and the hie R2 (hie is an input impedance of the transistor Q5) since an output impedance of the transistor Q4 is small. The impedance of Q4 is ordinarily a small value such as 10 to several 100 Ω. Therefore, the collector-emitter voltages Vce of the differentially coupled transistors Q1 and Q2 vary unevenly, and a distortion of Cob appears.

In FIG. 2, the load impedances of the differentially coupled transistors Q1 and Q2 are matched to a certain extent by setting a value of a condenser C1 and a resistor R3 suitably. However, a distortion of Cob appears since the output signals from the base of Q1 and the collector of Q2 are not in phase with each other.

The present invention offers a differential amplifier which suppresses any distortion of Cob depending on Vce by maintaining a balance between the collector-emitter voltages Vce of the differentially coupled transistors.

The differential amplifier which solves the above-mentioned problems comprises:

a first transistor and a second transistor which are differential coupled, a load which is connected with collectors of the first and second transistors, and a third transistor of which a base is connected at a junction point between a collector of the first transistor supplying an output signal and a load, an emitter-collector path of the third transistor being connected between the collector of the second transistor and the load.

The emitter voltage of the third transistor is nearly equal to the base voltage of the third transistor, even if the load impedance of the first and the second transistors are different from each other. Therefore, the collector voltage of the transistor Q1 which does not supply an output signal, is equal with the collector voltage of the transistor Q2 which supplies an output signal through the emitter and collector of the third transistor.

Thus, the collector-emitter voltages Vce of the first and the second transistors vary substantially evenly. The outputs of the first and second transistors are in phase as a result of the connection with the third transistor. From the above mentioned structure, distortion of an output capacitance Cob depending on Vce is suppressed.

DESCRIPTION OF THE PREFERRED EMBODIMENT OF THE INVENTION

One preferred embodiment of this invention will now be described with reference to the accompanying drawings.

Figure 1:
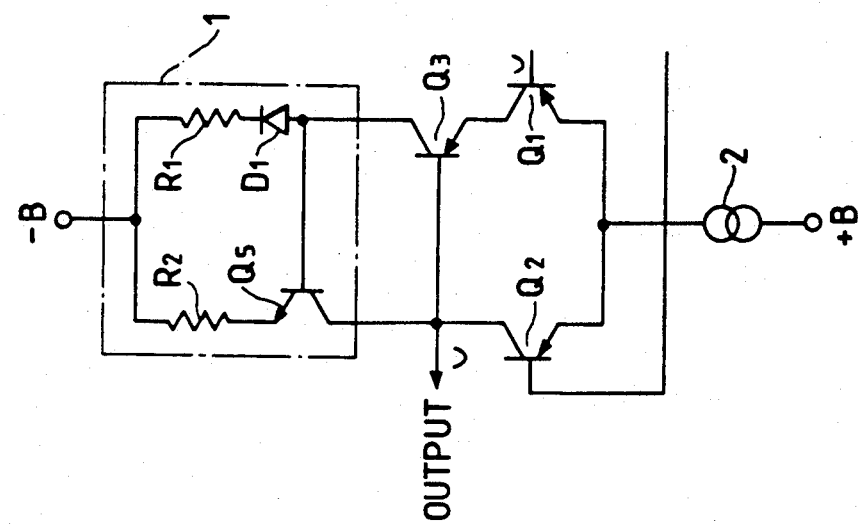
FIGS. 1 and 2 show embodiments of conventional differential amplifiers.
Figure 2:
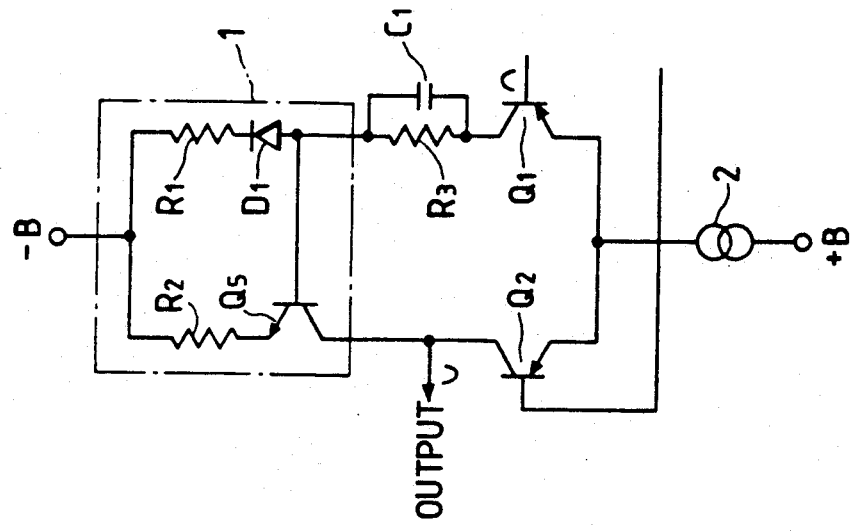
Figure 3:
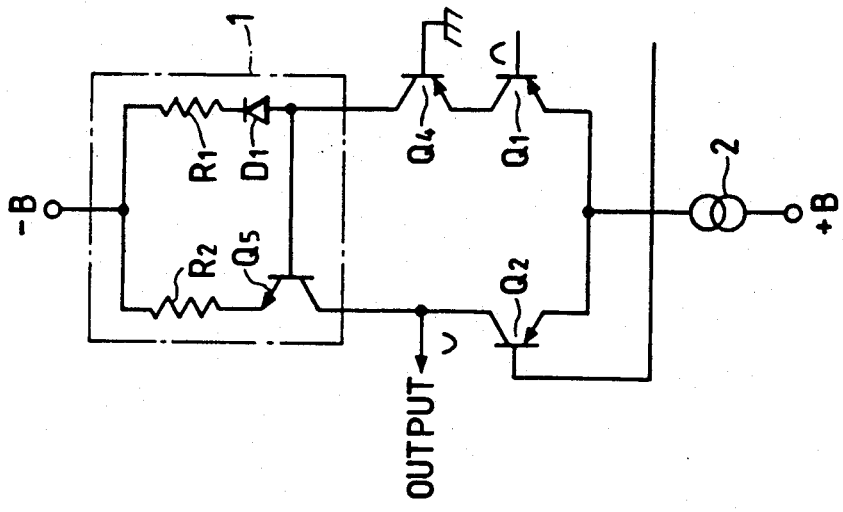
FIG. 3 shows an embodiment of a differential amplifier according to the present invention.

FIG. 3 is a circuit diagram showing a preferred embodiment of a differential amplifier according to the present invention. The members in this figure which are the same as in FIGS. 1 and 2 are referenced with the same numbers. In the embodiment shown in FIG. 3, a PNP type transistor Q3 is arranged. The base of the transistor Q3 is connected at the junction point of a collector of an output transistor Q2 and a current mirror circuit 1, and the emitter-collector path of the transistor Q3 is connected between the collector of transistor Q1 and a current mirror circuit 1. The emitter of Q3 is connected with the collector of Q1 and the collector of Q3 is connected with the current mirror circuit 1. The other members are arranged as described above with reference to FIGS. 1 and 2.

In the above embodiment, when an input signal is applied at the base of the differential transistors Q1 and Q2, a D.C. component V3 and an A.C. component v3 will constitute the collector voltage of the transistor Q2, and the impedance of a current generator 2 will be zero. Consequently, a collector-emitter voltage VceQ2 of the output transistor Q2 is $$VceQ2 = B - (V3 + v3) \qquad (1),$$

and a collector-emitter voltage VceQ1 of the transistor Q1 is $$VceQ1 = B - (V3 - v3) - VbeQ3 \quad (2).$$

wherein VbeQ3 is a forward base-emitter voltage of the terminal of the transistor Q3 and is about 0.7 V. The D.C. component of collector voltage V3 of the transistor Q2 is set near a median voltage between +B and −B of a voltage generator to be kept near a zero voltage level. The collector-emitter voltages VceQ1 and VceQ2 of the coupled transistors Q1 and Q2 are approximately (B −v3). The amplitudes and the phases of VceQ1 and VceQ2 are equal in value and alternate in a balanced manner, so the output capacitances Cob for the same collector-emitter voltage Vce of Q1 and Q2 are also equal. The characteristic of Cob is uniform, and distortion of Cob is suppressed. Distortions in even dimensions may also be denied by a push-pull operation of the differentially coupled transistors Q1 and Q2.

Besides, in the case that the D.C. collector voltage V3 is not zero, but is a determined D.C. voltage, equations (1) and (2) indicate that VceQ1 and VceQ2 alternate with the same amplitude in phase and a distortion of Cob may be suppressed. A load other than a current mirror circuit may be connected with the differentially coupled transistors Q1 and Q2.

EFFECTS OF THE INVENTION

According to the present invention by the above-mentioned description, a distortion by an output capacity is suppressed even if an input signal which has a large amplitude is applied, since the collector-emitter voltage of the differentially coupled transistors varies similarily to the input signal in phase and level.

What is claimed is:

1. A differential amplifier comprising:
   a first and second transistors which are differentially coupled, said first transistor supplying an output voltage directly from a collector thereof;
   a load connected with collectors of said first and second transistors; and
   a third transistor having a base directly connected to the collector of said first transistor and having an emitter-collector path connected between the collector of said second transistor and said load, said third transistor maintaining a constant voltage difference between a collector-emitter voltage of the first transistor and a collector-emitter voltage of the second transistor.

2. The differential amplifier according to claim 1, wherein said load is a current mirror circuit.

3. The differential amplifier according to claim 1, wherein said transistors are integrated devices.

4. The differential amplifier according to claim 1, wherein said first and second transistors are PNP type transistors.

5. The differential amplifier according to claim 1, wherein an input signal is applied at base terminals of the first and second transistors, such that a phase and level of said input signal varies similarly to a phase and level of the collector-emitter voltage of the first and second transistors.

6. The differential amplifier according to claim 2, wherein said current mirror includes first and second resistors, and a fourth transistor having a collector-emitter path between the collection of the first transistor and the second resistor and having a base connected with the collector of the third transistor.

7. The differential amplifier according to claim 1, wherein a voltage potential between the emitter and base of the third transistor is substantially small, even when load impedances of the first and second transistors differ from one another.

8. The differential amplifier according to claim 1, wherein emitters of said first and second transistors are coupled to a current generator.

9. The differential amplifier according to claim 1, wherein said third transistor maintains said collector-emitter voltages of the first and second transistors in phase with one another.

10. The differential amplifier according to claim 1, wherein said first, second and third transistors are of a same transistor type.

* * * * *